United States Patent
Lee

(10) Patent No.: US 11,664,818 B2
(45) Date of Patent: May 30, 2023

(54) NEURAL NETWORK PROCESSOR FOR COMPRESSING FEATUREMAP DATA AND COMPUTING SYSTEM INCLUDING THE SAME

(71) Applicant: SAMSUNG ELECTRONICS CO., LTD., Suwon-si (KR)

(72) Inventor: Heonsoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 604 days.

(21) Appl. No.: 16/734,856

(22) Filed: Jan. 6, 2020

(65) Prior Publication Data
US 2020/0356844 A1   Nov. 12, 2020

(30) Foreign Application Priority Data
May 10, 2019   (KR) .................. 10-2019-0055157

(51) Int. Cl.
*G06N 3/063* (2023.01)
*G06N 3/04* (2023.01)
*H03M 7/30* (2006.01)
*G06F 18/213* (2023.01)

(52) U.S. Cl.
CPC .......... *G06N 3/063* (2013.01); *G06F 18/213* (2023.01); *G06N 3/04* (2013.01); *H03M 7/3066* (2013.01)

(58) Field of Classification Search
CPC ........ G06N 3/063; G06N 3/04; G06N 3/0454; G06N 3/08; G06K 9/6232; G06K 9/627; H03M 7/3066; H03M 7/3059; G06V 10/82; G06V 20/46; G06V 10/40
See application file for complete search history.

(56) References Cited

U.S. PATENT DOCUMENTS

| | | |
|---|---|---|
| 6,915,015 B1 | 7/2005 | Taubman et al. |
| 8,086,052 B2 | 12/2011 | Toth et al. |
| 9,275,328 B1 | 3/2016 | Minkovich et al. |
| 9,860,546 B2 | 1/2018 | Kim et al. |
| 2016/0358069 A1 | 12/2016 | Brothers et al. |
| 2018/0247180 A1 | 8/2018 | Cheng et al. |
| 2018/0300606 A1* | 10/2018 | Corkery ............... G06F 9/3836 |
| 2018/0330239 A1 | 11/2018 | Chen et al. |
| 2020/0280717 A1* | 9/2020 | Li ........................... G06N 3/04 |

FOREIGN PATENT DOCUMENTS

JP    2018-89142 A    6/2018

OTHER PUBLICATIONS

Parashar, A., et al., "SCNN: An Accelerator for Compressed-sparse Convolutional Neural Networks", Jun. 24-28, 2017, ISCA '17, 14 pages total.

* cited by examiner

Primary Examiner — Dhaval V Patel
(74) Attorney, Agent, or Firm — Sughrue Mion, PLLC

(57) ABSTRACT

Provided is a neural network device including at least one processor configured to implement an arithmetic circuit configured to generate third data including a plurality of pixels based on a neural network configured to perform an arithmetic operation on first data and second data, and a compressor configured to generate compressed data by compressing the third data, wherein the compressor is further configured to generate, as the compressed data, bitmap data comprising location information about a non-zero pixel having a non-zero data value among the plurality of pixels based on a quad-tree structure.

17 Claims, 18 Drawing Sheets

FIG. 4B
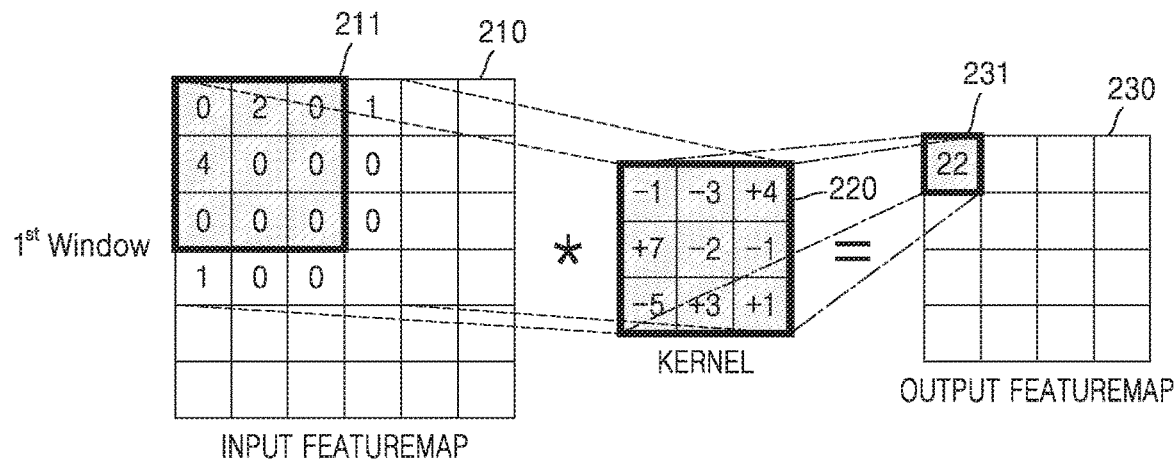
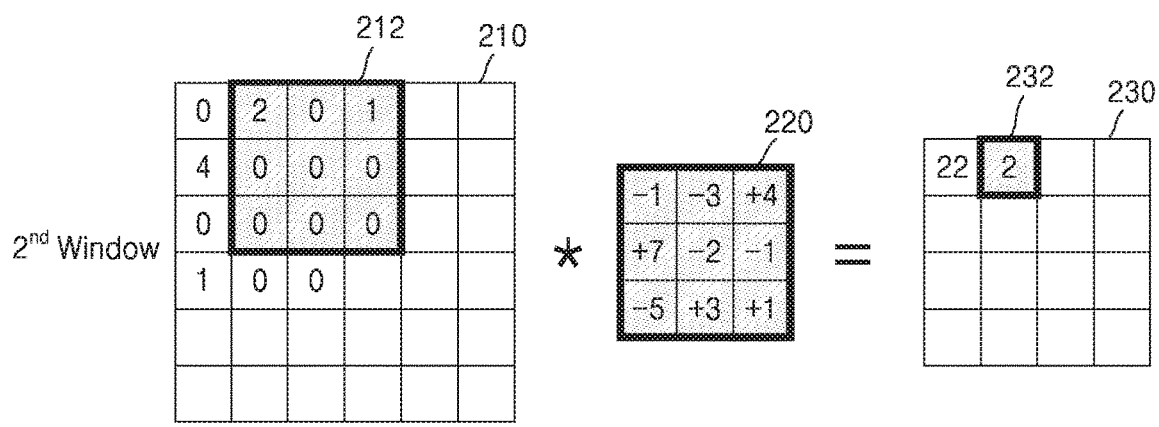
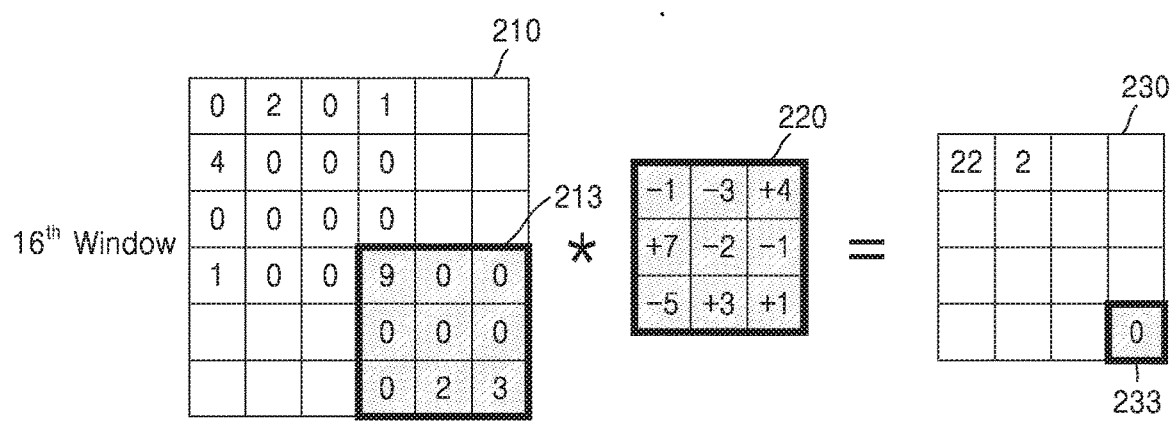

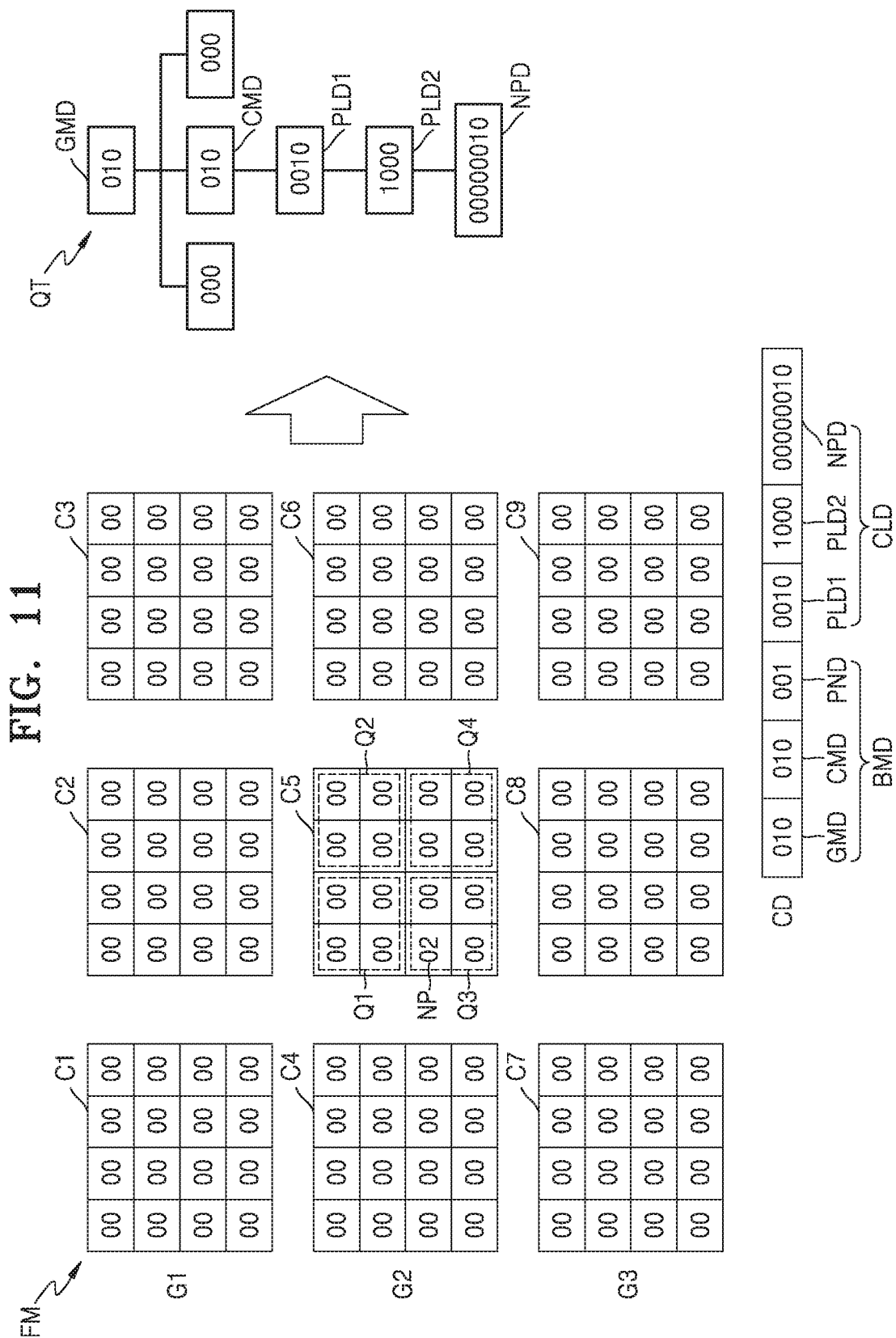

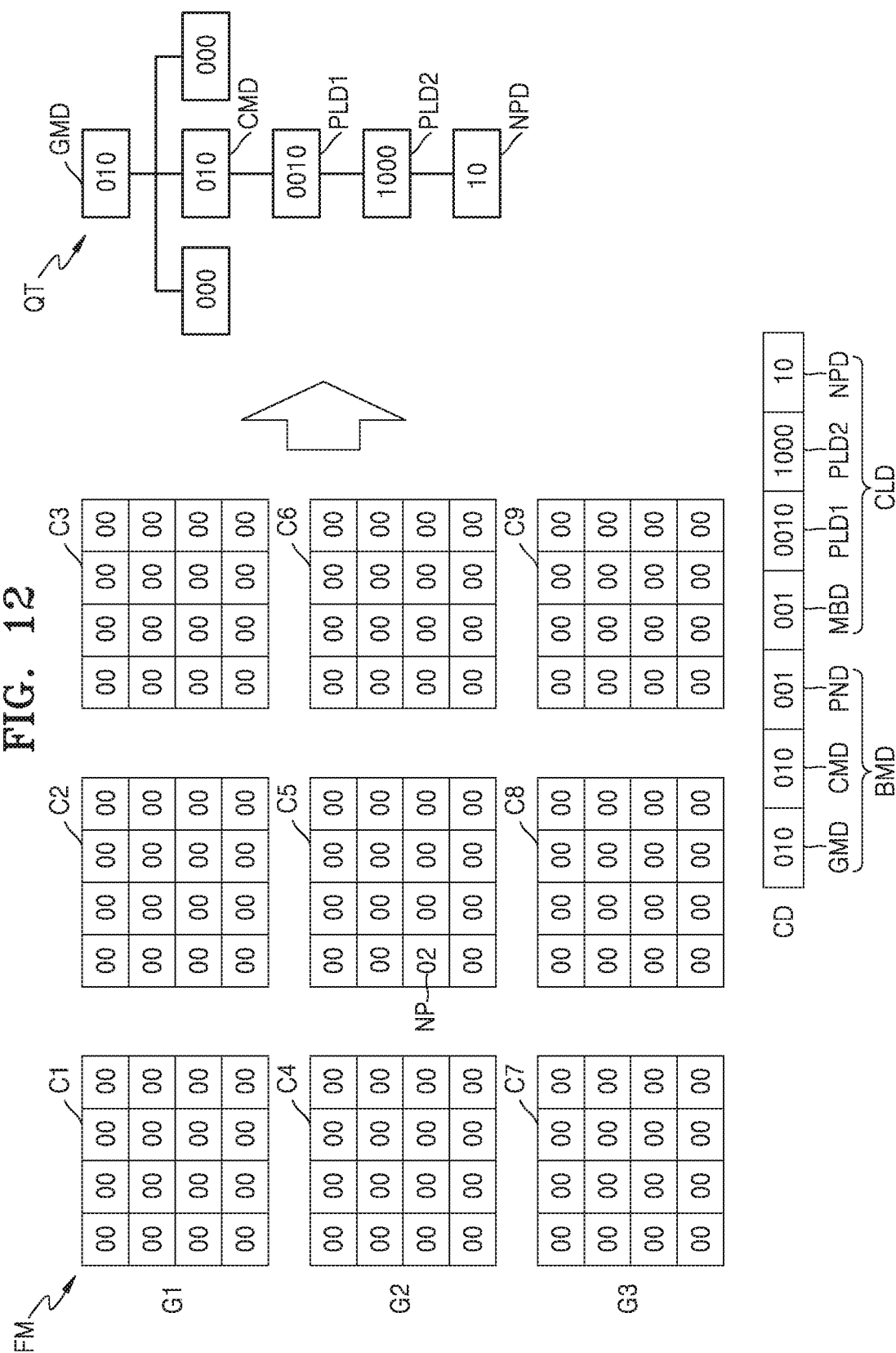

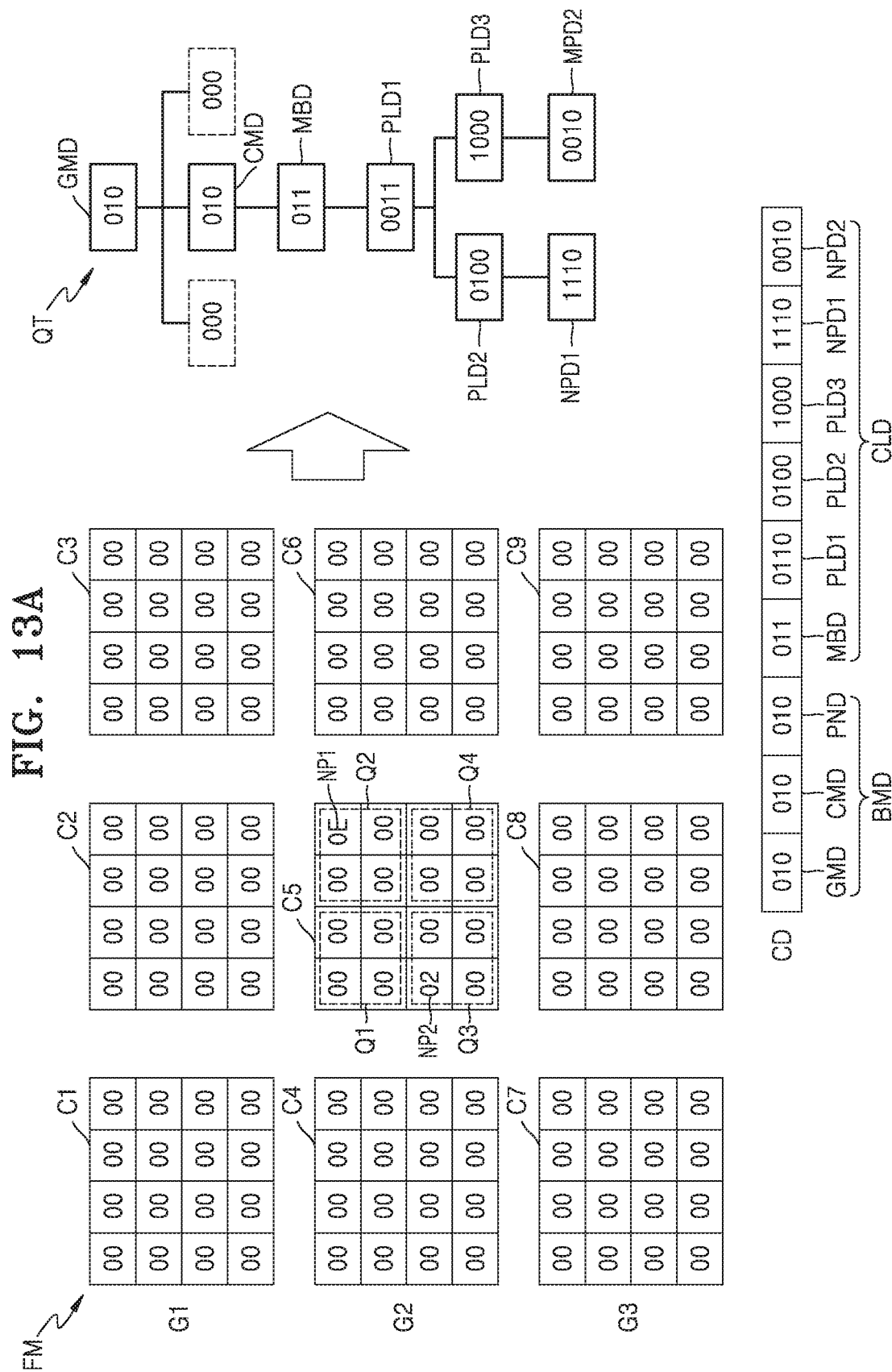

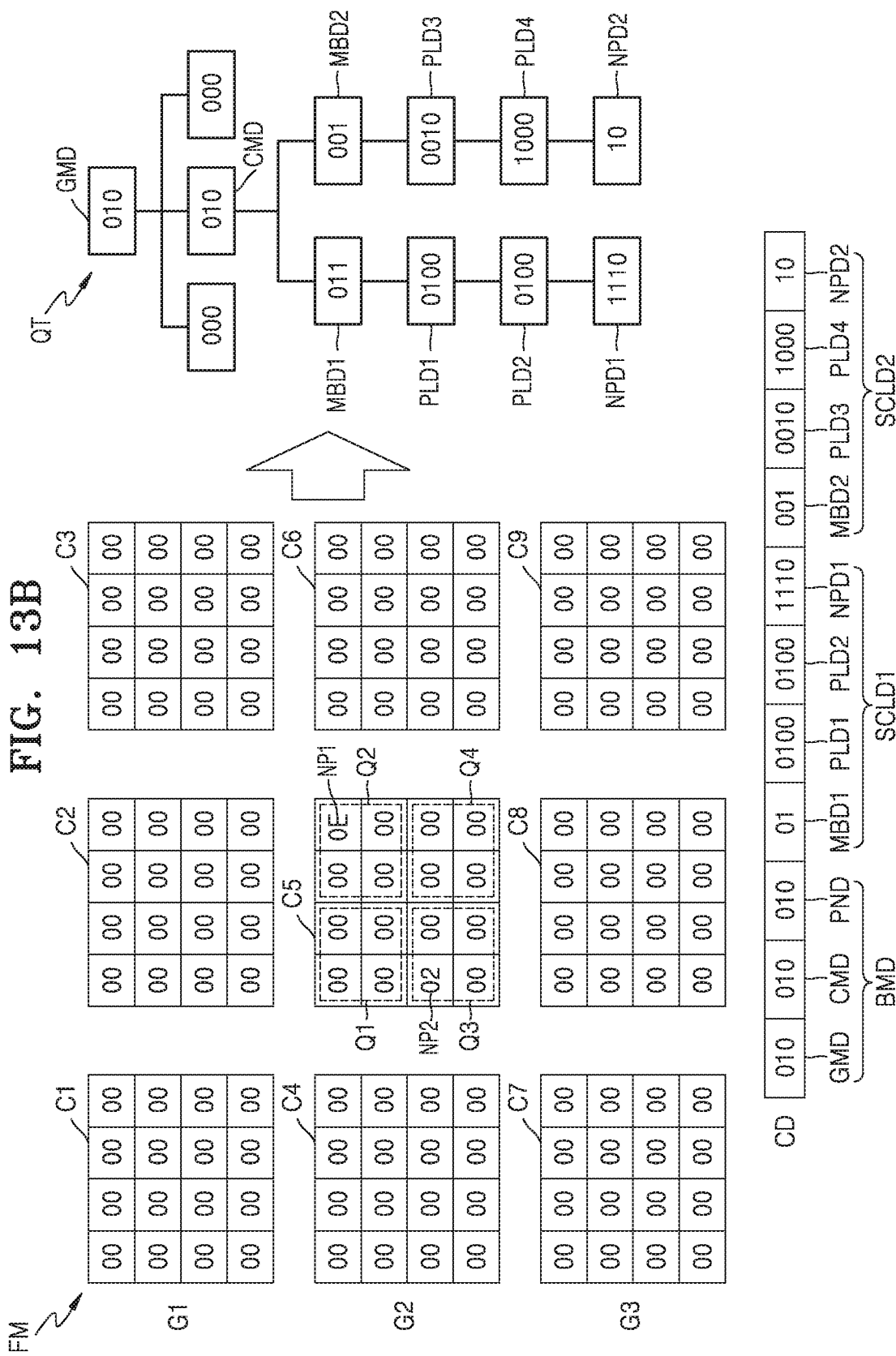

NEURAL NETWORK PROCESSOR FOR COMPRESSING FEATUREMAP DATA AND COMPUTING SYSTEM INCLUDING THE SAME

CROSS-REFERENCE TO RELATED APPLICATION

This application claims priority from Korean Patent Application No. 10-2019-0055157, filed on May 10, 2019 in the Korean Intellectual Property Office, the disclosure of which is incorporated herein in its entirety by reference.

BACKGROUND

1. Field

Example embodiments of the present application relate to a neural network processor, and more particularly, to a neural network processor for compressing featuremap data and a computing system including the same.

2. Description of the Related Art

A neural network refers to a computational architecture which models a biological brain. Recently, along with the development of neural network technology, research into analyzing input data and extracting information by using a neural network device using one or more neural network models in various types of electronic systems has been conducted.

A neural network processor requires a high amount of arithmetic operations on complex input data, wherein an operation of writing or reading input data in or from an external memory of the neural network processor is needed. Accordingly, because a data volume of the input data is large, a long time is needed to write or read the input data in or from the external memory.

SUMMARY

One or more example embodiments provide a neural network processor for efficiently compressing input data and a neural network device including the same.

One or more example embodiments also provide a compression method of efficiently compressing input data.

According to an aspect of an example embodiment, there is provided a neural network device including at least one processor configured to implement an arithmetic circuit configured to generate third data including a plurality of pixels based on a neural network configured to perform an arithmetic operation on first data and second data, and a compressor configured to generate compressed data by compressing the third data, wherein the compressor is further configured to generate, as the compressed data, bitmap data including location information about a non-zero pixel having a non-zero data value among the plurality of pixels based on a quad-tree structure.

According to another aspect of an example embodiment, there is provided a computing system including a memory configured to store at least one program, and a processor configured to process an arithmetic operation of a neural network on a featuremap including a plurality of pixels by executing the at least one program, wherein the processor is further configured to compress the featuremap by generating bitmap data including location information about a non-zero pixel having a non-zero data value among the plurality of pixels.

According to another aspect of an example embodiment, there is provided a method of processing a featuremap of a neural network in a computing system including a memory, the method including generating compressed data based on location information repetitively indicating a location, on a division plane of the featuremap, about a non-zero pixel having a non-zero data value among a plurality of pixels included in the featuremap and based on data of the non-zero pixel, and storing the compressed data in the memory.

BRIEF DESCRIPTION OF THE DRAWINGS

The above and/or other aspects will become apparent and more readily appreciated from the following description of example embodiments, taken in conjunction with the accompanying drawings in which:

FIGS. 4A and 4B illustrate a convolution operation of a neural network;

FIG. 11 illustrates a method of generating compressed data according to an example embodiment;

FIG. 12 illustrates a method of generating compressed data according to another example embodiment;

FIG. 13A illustrates a method of generating compressed data according to another example embodiment;

FIG. 13B illustrates a method of generating compressed data according to another example embodiment;

DETAILED DESCRIPTION OF THE EMBODIMENTS

Hereinafter, example embodiments will be described in detail with reference to the accompanying drawings.

Figure 1:
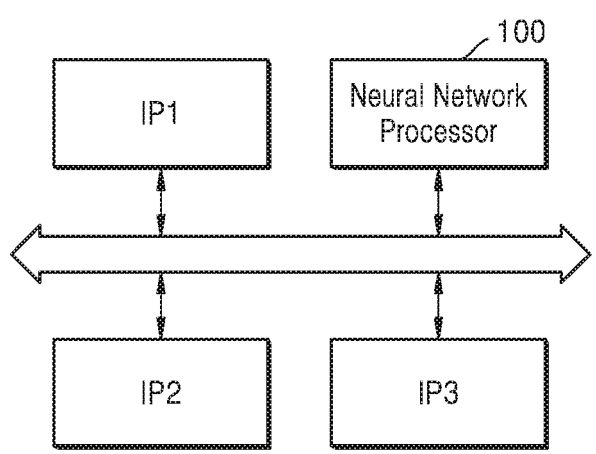
FIG. 1 is a block diagram of an electronic system according to an example embodiment.

FIG. 1 is a block diagram of an electronic system 10 according to an example embodiment.

Referring to FIG. 1, the electronic system 10 may extract effective information by analyzing real-time input data based on a neural network and determine a context or control components of an electronic device including the electronic system 10 based on the extracted information. For example, the electronic system 10 may be applied to a drone, an advanced drivers assistance system (ADAS), a robot device, a smart television (TV), a smartphone, a medical device, a mobile device, an image display device, a measurement device, an Internet of Things (IoT) device, and the like, but example embodiments are not limited thereto, and the electronic system 10 may be applied to various other types of electronic devices.

The electronic system 10 may include at least one intellectual property (IP) block and a neural network processor 100. For example, the electronic system 10 may include a first IP block IP1, a second IP block IP2, and a third IP block IP3 and the neural network processor 100.

The electronic system 10 may include various types of IP blocks. For example, the IP blocks may include a processing unit, a plurality of cores included in a processing unit, a multi-format codec (MFC), a video module (e.g., a camera interface, a joint photographic experts group (JPEG) processor, a video processor, a mixer, or the like), a three-dimensional (3D) graphic core, an audio system, a driver, a display driver, a volatile memory, a nonvolatile memory, a memory controller, an input and output interface block, a cache memory, or the like. Each of the first IP block IP1 to the third IP block IP3 may include at least one of the various types of IP blocks.

Techniques of connecting IP blocks include a connection scheme based on a system bus. For example, an advanced microcontroller bus architecture (AMBA) protocol of advanced RISC Machine (ARM) may be applied as a standard bus specification. Bus types of the AMBA protocol may include advanced high-performance bus (AHB), advanced peripheral bus (APB), advanced extensible interface (AXI), AXI4, AXI coherency extensions (ACE), and the like. AXI among the bus types described above is an interface protocol between IP blocks and may provide a multiple outstanding address function, a data interleaving function, and the like. Besides the above, other types of protocols such as uNetwork of SONICs Inc., CoreConnect of IBM, and an open core protocol of OCP-IP may be applied to the system bus.

The neural network processor 100 may generate a neural network, train the neural network (or allow the neural network to learn), perform an arithmetic operation based on received input data and generate an information signal based on the arithmetic operation result, or retrain the neural network. Models of a neural network may include various types of models such as convolutional neural networks (CNNs) including GoogleNet, AlexNet, VGG Network, and the like, a region with convolutional neural network (R-CNN), a region proposal network (RPN), a recurrent neural network (RNN), a stacking-based deep neural network (S-DNN), a state-space dynamic neural network (S-SDNN), a deconvolution network, a deep brief network (DBN), a restricted Boltzmann machine (RBM), a fully convolutional network, a long short-term memory (LSTM) network, a classification network, and the like, but are not limited thereto. The neural network processor 100 may include one or more processors configured to perform arithmetic operations according to models of a neural network. In addition, the neural network processor 100 may include a separate memory storing programs corresponding to models of a neural network. The neural network processor 100 may be a neural network processing device, a neural network integrated circuit, a neural network processing unit (NPU), or the like.

The neural network processor 100 may receive various types of input data from at least one IP block via the system bus and generate an information signal based on the input data. For example, the neural network processor 100 may generate the information signal by performing a neural network operation on the input data, and the neural network operation may include a convolution operation. The convolution operation of the neural network processor 100 will be described in detail with reference to FIGS. 4A and 4B. The information signal generated by the neural network processor 100 may include at least one of various types of recognition signals such as a speech recognition signal, an object recognition signal, an image recognition signal, and a bioinformation recognition signal. For example, the neural network processor 100 may receive, as input data, frame data included in a video stream and generate, from the frame data, a recognition signal for an object included in an image indicated by the frame data. However, the neural network processor 100 is not limited thereto, and the neural network processor 100 may receive various types of input data and generate recognition signals according to the input data.

According to the electronic system 10 according to an example embodiment, the neural network processor 100 may identify a zero pixel having zero ('0') as a data value and a none zero pixel having a non-zero value as a data value among a plurality of pixels included in input featuremap data to be used for a convolution operation. Based on the identification, the neural network processor 100 may generate compressed data by using a data value of a non-zero pixel and location information of the non-zero pixel. The neural network processor 100 may generate compressed data of a relatively small data volume by compressing featuremap data and store the generated compressed data in an external memory, thereby increasing a data input and output speed.

In the present specification, for convenience of description, a pixel having zero ('0') as a data value among a plurality of pixels included in a featuremap is referred to as a zero pixel, and a pixel having a non-zero value as a data value among the plurality of pixels is referred to as a non-zero pixel.

Figure 2:
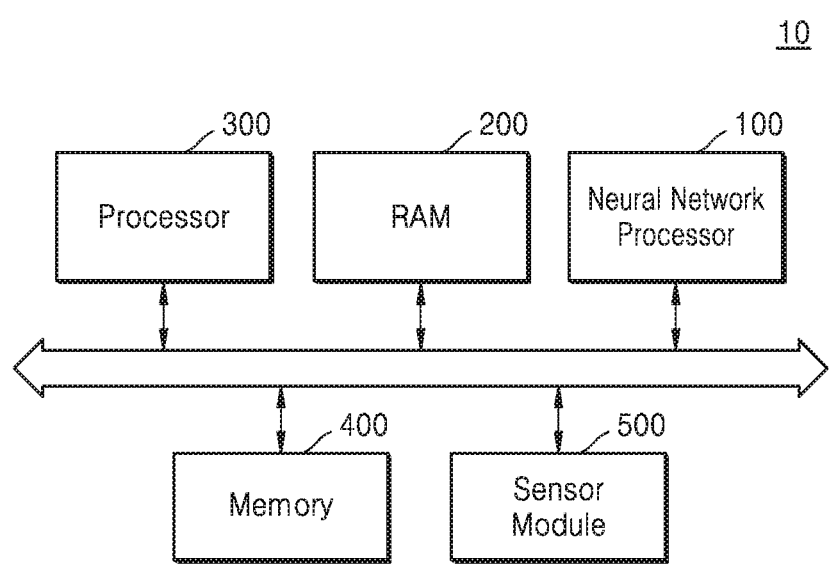
FIG. 2 is a block diagram of the electronic system according to another example embodiment.

FIG. 2 is a block diagram of the electronic system 10 according to another example embodiment. The description made with reference to FIG. 1 for the electronic system 10 of FIG. 2 is not repeated herein.

Referring to FIG. 2, the electronic system 10 may include the neural network processor 100, random access memory (RAM) 200, a processor 300, a memory 400, and a sensor module 500. The neural network processor 100 may correspond to the neural network processor 100 of FIG. 1.

The RAM 200 may temporarily store programs, data, or instructions. For example, programs and/or data stored in the memory 400 may be temporarily loaded on the RAM 200 according to control of the processor 300 or booting code. The RAM 200 may be implemented by using a memory such as dynamic RAM (DRAM) or static RAM (SRAM).

The processor 300 may control a general operation of the electronic system 10, and for example, the processor 300 may be a central processing unit (CPU). The processor 300 may include a single core or multiple cores. The processor 300 may process or execute programs and/or data stored in the RAM 200 and the memory 400. For example, the processor 300 may control functions of the electronic system 10 by executing programs stored in the memory 400.

The memory 400 is a storage storing data and may store, for example, an operating system (OS), various kinds of programs, and various kinds of data. The memory 400 may include DRAM but is not limited thereto. The memory 400 may include at least one of a volatile memory and a nonvolatile memory. The nonvolatile memory may include read only memory (ROM), programmable ROM (PROM), electrically programmable ROM (EPROM), electrically erasable and programmable ROM (EEPROM), a flash memory, phase-change RAM (PRAM), magnetic RAM (MRAM), resistive RAM (RRAM), ferroelectric RAM (FeRAM), and the like. The volatile memory may include a DRAM, SRAM, synchronous DRAM (SDRAM), PRAM, MRAM, RRAM, FeRAM, and the like. In addition, according to an example embodiment, the memory 400 may include at least one of a hard disk drive (HDD), a solid state drive (SSD), a compact flash (CF) card, a secure digital (SD) card, a micro secure digital (Micro-SD) card, a mini secure digital (Mini-SD) card, an extreme digital (XD) card, or a memory stick.

The sensor module 500 may collect information on the periphery of the electronic system 10. The sensor module 500 may sense or receive an image signal from the outside of the electronic system 10 and convert the sensed or received image signal into image data, i.e., an image frame. To this end, the sensor module 500 may include a sensing device, for example, at least one of various types of sensing devices such as an imaging device, an image sensor, a light detection and ranging (LIDAR) sensor, an ultrasonic sensor, and an infrared sensor or receive a sensing signal from the sensing device. According to an example embodiment, the sensor module 500 may provide an image frame to the neural network processor 100. For example, the sensor module 500 may include an image sensor, and generate a video stream by photographing an external environment of the electronic system 10 and sequentially provide consecutive image frames of the video frame to the neural network processor 100.

According to the electronic system 10 according to an example embodiment, the neural network processor 100 may generate compressed data by using a data value of a non-zero pixel and location information of the non-zero pixel as described above, and store the generated compressed data in the RAM 200 or the memory 400. The neural network processor 100 may temporarily store the compressed data in the RAM 200 and process a corresponding arithmetic operation by using the temporarily stored compressed data, thereby increasing a processing speed of a neural network. In addition, the neural network processor 100 may store the compressed data in the memory 400, thereby storing featuremap data of a relatively small volume.

Figure 3:
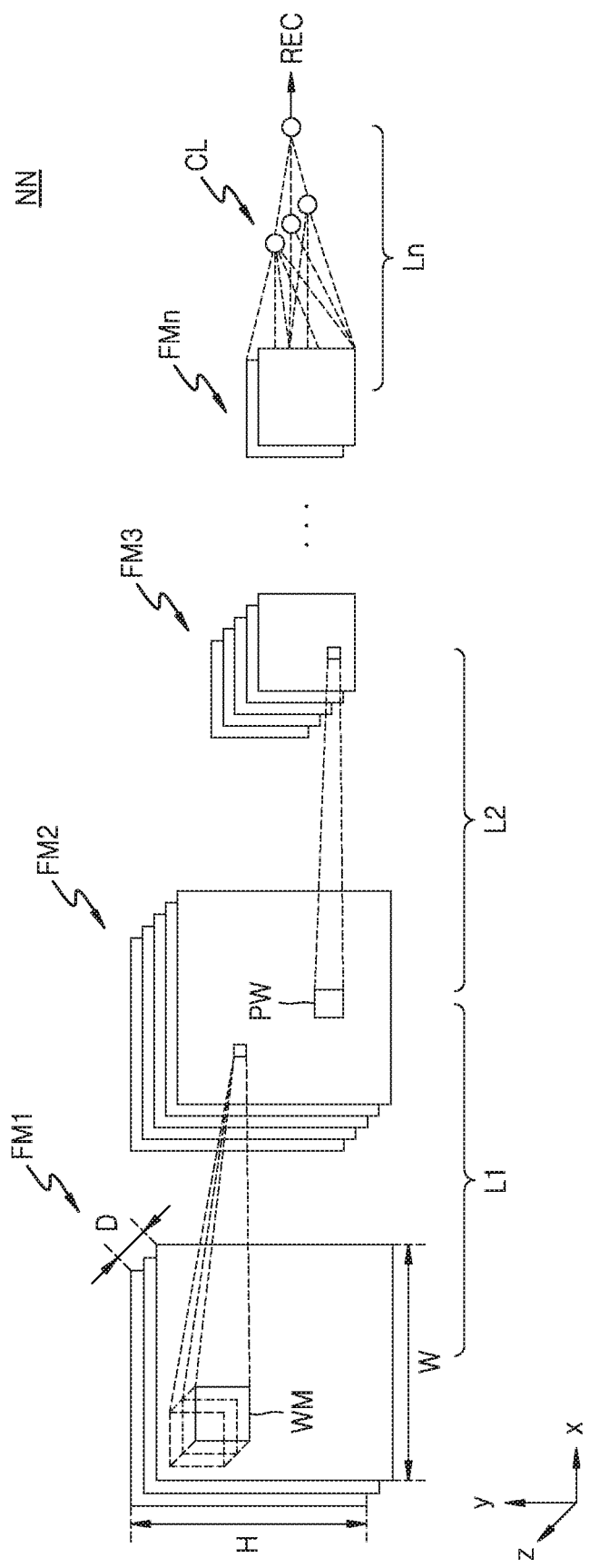
FIG. 3 illustrates a neural network.

FIG. 3 illustrates a structure of a convolution neural network as an example of a neural network structure.

Referring to FIG. 3, a neural network NN may include a plurality of layers, e.g., first to nth layers, L1 to Ln. Each of the plurality of layers L1 to Ln may be a linear layer or a nonlinear layer, and according to an example embodiment, at least one linear layer and at least one nonlinear layer may be combined and referred to as one layer. For example, a linear layer may include a convolution layer and a fully connected layer, and a nonlinear layer may include a pooling layer and an activation layer.

For example, the first layer L1 may be a convolution layer, the second layer L2 may be a pooling layer, and the nth layer Ln may be a fully connected layer as an output layer. The neural network NN may further include an activation layer and may further include a layer configured to perform another type of arithmetic operation.

Each of the plurality of layers L1 to Ln may receive, as an input featuremap, input data (e.g., an image frame) or a featuremap generated in a previous layer, and perform an arithmetic operation on the input featuremap, thereby generating an output featuremap or a recognition signal REC. In this case, a featuremap indicates data representing various features of input data. First to nth featuremaps FM1, FM2, . . . FMn may have, for example, a 2D matrix or 3D matrix (or tensor) format. The first to nth featuremaps FM1, FM2, . . . FMn may have width (or column) W, height (or row) H, and depth D, respectively corresponding to an x-axis, a y-axis, and a z-axis on a coordinate system. Herein, the depth D may be referred to as the number of channels.

The first layer L1 may generate the second featuremap FM2 by convoluting the first featuremap FM1 and a weightmap WM. The weightmap WM may filter the first featuremap FM1 and may also be referred to as a filter or a kernel. A depth, i.e., the number of channels, of the weightmap WM is the same as a depth, i.e., the number of channels of the first featuremap FM1, and the same channels of the weightmap WM and the first featuremap FM1 may be convoluted. The weightmap WM may be shifted in a manner of traversing by using the first featuremap FM1 as a sliding window. A shifted amount may be referred to as "stride length" or "stride". During each shift, each weight values included in the weightmap WM may be multiplied by and added to all pixel data in a region overlapping the first featuremap FM1. Data of the first featuremap FM1 in the region where each of the weight values included in the weightmap WM overlaps the first featuremap FM1 may be referred to as extraction data. According to the convolution of the first featuremap FM1 and the weightmap WM, one channel of the second featuremap FM2 may be generated. Although FIG. 3 shows one weightmap WM, substantially a plurality of weightmaps may be convoluted with the first featuremap FM1 to generate a plurality of channels of the second featuremap FM2, and the number of channels of the second featuremap FM2 may correspond to the number of weightmaps.

The second layer L2 may generate the third featuremap FM3 by changing a spatial size of the second featuremap FM2 through pooling. The pooling may be referred to as sampling or down-sampling. A 2D pooling window PW may be shifted on the second featuremap FM2 in a unit of a size of the pooling window PW, and a maximum value of pixel data (or a mean value of the pixel data) in a region overlapped with the pooling window PW may be selected. Accordingly, the third featuremap FM3 having a changed spatial size from the second featuremap FM2 may be generated. The number of channels of the third featuremap FM3 is the same as the number of channels of the second featuremap FM2.

The nth layer Ln may classify classes CL of the input data by combining features of the nth featuremap FMn. In addition, the nth layer Ln may generate a recognition signal SEC corresponding to a class. According to an example embodiment, the input data may correspond to frame data included in a video stream, and the nth layer Ln may extract a class corresponding to an object included in an image indicated by frame data based on the nth featuremap FMn provided from a previous layer to recognize the object and generate a recognition signal REC corresponding to the recognized object.

Figure 4A:
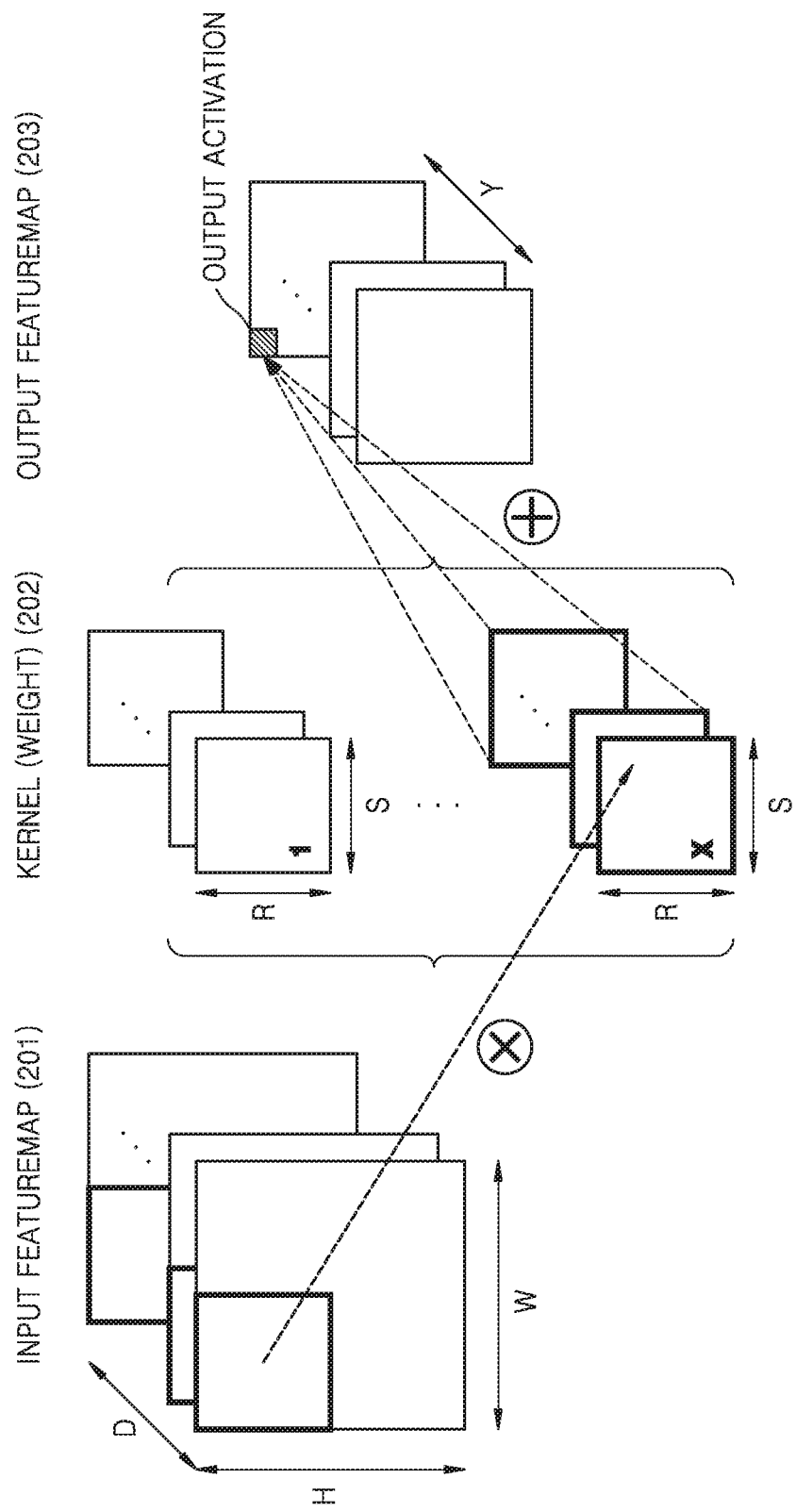

FIGS. 4A and 4B illustrate a convolution operation of a neural network.

Referring to FIG. 4A, input featuremaps 201 may include D channels, and an input featuremap of each channel may have a size of an H row and a W column, where D, H, and W are natural numbers. Each of kernels 202 may have a size of an R row and an S column, and the kernels 202 may include channels of a number corresponding to the number of channels (or depth) D of the input featuremaps 201, where R and S are natural numbers. Output featuremaps (203) may be generated through a 3D convolution operation between the input featuremaps 201 and the kernels 202 and may include Y channels according to the convolution operation.

An operation of generating an output featuremap through a convolution operation between one input featuremap and one kernel may be described with reference to FIG. 4B. A 2D convolution operation described with reference to FIG. 4B may be performed between the input featuremaps 201 of all channels and the kernels 202 of all the channels to generate the output featuremaps (203) of all the channels.

Referring to FIG. 4B, as an example, an input featuremap 210 has a 6×6 size, an original kernel 220 has a 3×3 size, and an output featuremap 230 has a 4×4 size. However, the size of the input featuremap 210, the original kernel 220, and the output featuremap 230 are not limited thereto, and a neural network may be implemented by various sizes of featuremaps and kernels. In addition, all values defined in the input featuremap 210, the original kernel 220, and the output featuremap 230 are merely illustrative, and embodiments are not limited thereto.

A convolution operation may be performed while the original kernel 220 in a window unit of a 3×3 size is sliding on the input featuremap 210. The convolution operation may indicate an arithmetic operation of multiplying pixel data in a certain window by weight values at corresponding locations in the original kernel 220, respectively, and summing all values obtained through the multiplication to obtain each pixel data of the output featuremap 230. The data included in the window of the input featuremap 210, which is multiplied by the weight values, may be referred to as extraction data extracted from the input featuremap 210. In detail, first, a convolution operation may be performed between the original kernel 220 and first extraction data 211 of the input featuremap 210. That is, pixel data 0, 2, 0, 4, 0, 0, 0, 0, and 0 of the first extraction data 211 may be multiplied by weight values −1, −3, 4, 7, −2, −1, −5, 3, and 1 of the original kernel 220, respectively, and as a result of the multiplication, 0, −6, 0, 28, 0, 0, 0, 0, and 0 may be obtained. Next, 22, which is a result of summing all the obtained values, may be calculated, and pixel data 231 of a first row and a first column in the output featuremap 230 may be determined to be 22. Herein, the pixel data 231 of the first row and the first column in the output featuremap 230 corresponds to the first extraction data 211. Likewise, a convolution operation between second extraction data 212 of the input featuremap 210 and the original kernel 220 may be performed to determine 2 that is pixel data 232 of the first row and a second column in the output featuremap 230. Finally, a convolution operation between 16th extraction data 213 that is the last extraction data of the input featuremap 210 and the original kernel 220 may be performed to determine 0 that is pixel data 233 of a fourth row and a fourth column in the output featuremap 230.

A convolution operation between the one input featuremap 210 and the one original kernel 220 may be processed by repetitively performing a product of extraction data of the input featuremap 210 and corresponding weight values of the original kernel 220 and an addition of the product results. The output featuremap 230 may be generated as a result of the convolution operation.

According to an example embodiment, when a rectified linear unit (ReLU) function is applied to the input featuremap 210, negative pixel data may be replaced by '0'. As a result, the input featuremap 210 may include many zero pixels having '0' as a data value. According to an example embodiment, the neural network processor 100 may generate compressed data by using only location information of non-zero pixels and data values of the non-zero pixels, thereby reducing data of the input featuremap 210. A method performed by the neural network processor 100 of compressing data in the input featuremap 210 according to an example embodiment and an apparatus will be described in more detail with reference to the drawings below.

Figure 5:
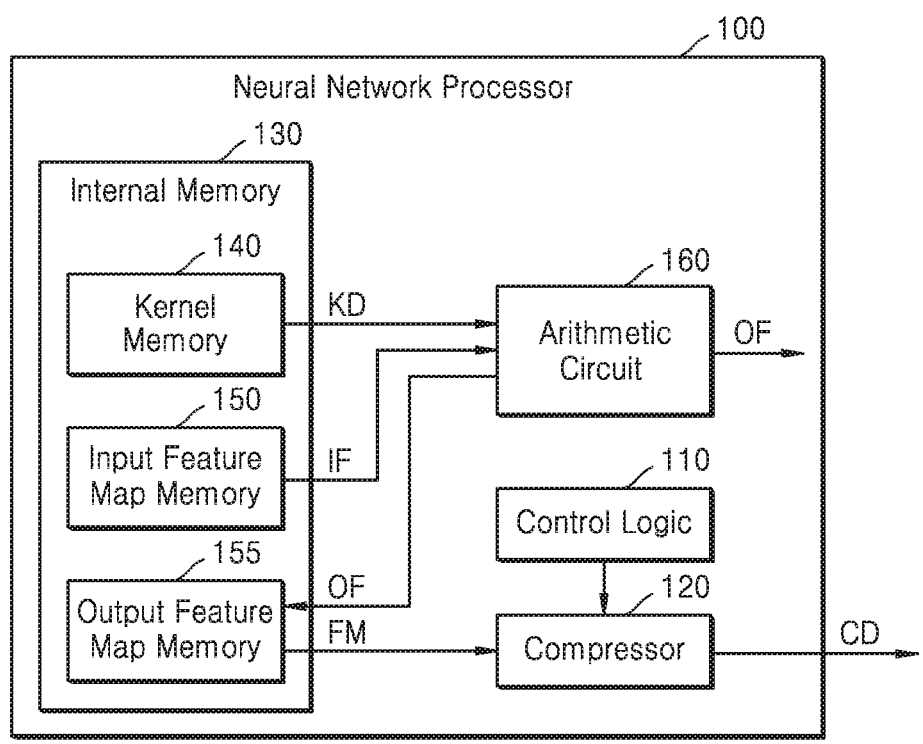
FIG. 5 is a block diagram of a neural network processor according to an example embodiment.

FIG. 5 is a block diagram of the neural network processor 100 according to an example embodiment.

Referring to FIG. 5, the neural network processor 100 may include a control logic 110, a compressor 120, an internal memory 130, and an arithmetic circuit 160.

The internal memory 130 may receive external data from the outside of the neural network processor 100. The external data may be input data. The internal memory 130 may store various kinds of data and weight values necessary for an arithmetic operation and the external data. To this end, the internal memory 130 may include a kernel memory 140 storing kernel data KD, an input featuremap memory 150 storing input featuremap IF, and an output featuremap memory 155 storing an output featuremap OF. The kernel memory 140, the input featuremap memory 150, and the output featuremap memory 155 may include one piece or separate pieces of hardware, but embodiments are not limited thereto. For example, the kernel memory 140, the input featuremap memory 150, and the output featuremap memory 155 may indicate memories corresponding different regions in one piece of hardware. Each of the kernel memory 140, the input featuremap memory 150, and the output featuremap memory 155 may be implemented by various types of memories such as DRAM, SRAM, and synchronous dynamic RAM (SDRAM).

The input featuremap memory 150 may store the input featuremap IF and provide the input featuremap IF to the arithmetic circuit 160 and the compressor 120. The kernel memory 140 may include the kernel data KD including a plurality of weight values to be used for a convolution operation and provide the kernel data KD to the arithmetic circuit 160. The output featuremap memory 155 may store the output featuremap OF received from the arithmetic circuit 160 and output a stored featuremap FM to the compressor 120.

The arithmetic circuit 160 may receive the input featuremap IF from the input featuremap memory 150 and receive the kernel data KD from the kernel memory 140. The arithmetic circuit 160 may generate the output featuremap OF by performing a convolution operation using the received input featuremap memory 150 and kernel data KD.

The control logic 110 may control a general operation of the neural network processor 100 and may be, for example, a CPU. The control logic 110 may include a single core or multiple cores. The control logic 110 may control functions of the neural network processor 100 by executing programs stored in the internal memory 130.

The compressor 120 may receive the featuremap FM and generate compressed data CD by using location information of a non-zero pixel having a value that is not zero ('0') as a data value among a plurality of pixels included in the featuremap FM and a data value of the non-zero pixel. The featuremap FM may include the input featuremap IF received from the outside or the output featuremap OF received from the arithmetic circuit 160. The compressor 120 may include a data processing circuit or software.

The compressor 120 may act as a decompressor configured to receive compressed data CD from the outside (e.g., the RAM 200 of FIG. 2) and decompress the received compressed data CD A decompression method may be performed in a reverse order of the compression method, and thus example embodiments may be applied to not only the compression method but also the decompression method of restoring the featuremap FM through compressed data. For example, the compressor 120 may receive compressed data CD from the outside and decompress the received compressed data CD to generate an input featuremap IF and store the generated input featuremap IF in the input featuremap memory 150.

Example embodiments of compressing input data includes, for example, compressing a featuremap FM, but embodiments are not limited thereto and other input data, for example, kernel data KD, may be compressed.

Figure 6:
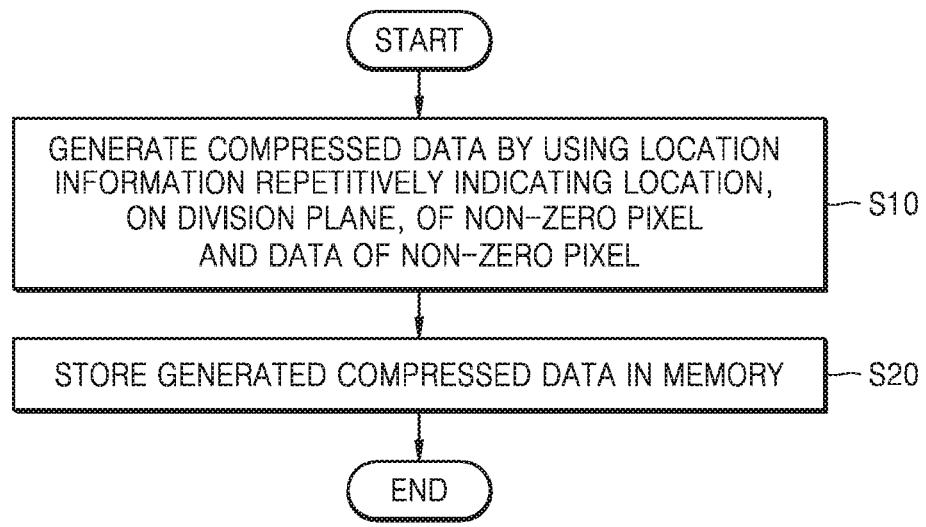
FIG. 6 is a flowchart of a method of operating a compressor according to an example embodiment.

FIG. 6 is a flowchart of a method of operating a compressor according to an example embodiment.

Referring to FIGS. 5 and 6, in operation S10, the compressor 120 may generate the compressed data CD by using location information repetitively indicating a location, on a division plane, of a non-zero pixel and a data value of the non-zero pixel. In operation S20, the compressor 120 may output the generated compressed data CD to a memory (e.g., the RAM 200 of FIG. 2) such that the generated compressed data CD is stored in the memory.

Figure 7:
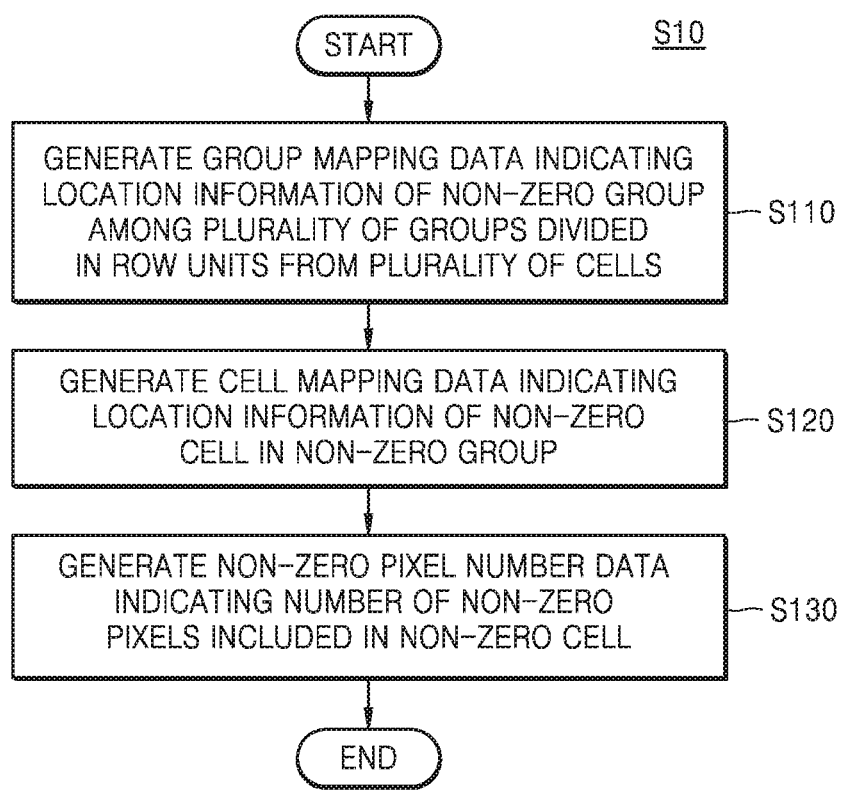
FIG. 7 is a flowchart of a method of operating a compressor according to another example embodiment.

FIG. 7 is a flowchart of a method of operating a compressor according to another example embodiment. FIG. 7 may be at least a portion (S10 of FIG. 6) of a method, performed by a compressor, of generating compressed data and shows a method of generating bitmap data indicating location information of a non-zero cell including a non-zero pixel.

Referring to FIGS. 5 and 7, in operation S110, the compressor 120 may generate group mapping data indicating location information of a non-zero group including at least one non-zero pixel among a plurality of groups divided in row units from a plurality of cells.

According to an example embodiment, the plurality of cells indicate pixel units, each pixel unit including N×N pixels, where N is a natural number, and a cell including at least one non-zero pixel may be referred to as a non-zero cell.

In operation S120, the compressor 120 may generate cell mapping data indicating location information of a non-zero cell in a non-zero group. In operation S130, the compressor 120 may generate pixel number data indicating the number of non-zero pixels included in the non-zero cell.

According to an example embodiment, the compressor 120 may generate bitmap data including hierarchical data indicating a location of a non-zero pixel according to a division plane, and as described above in the present specification, a method of indicating a location of a non-zero pixel by generating hierarchical data based on a division plane may be referred to as a quad-tree scheme. The quad-tree scheme will be described in detail with reference to FIG. 11.

According to an example embodiment, the compressor 120 may generate bitmap data including group mapping data indicating location information of a non-zero group, cell mapping data indicating location information of a non-zero cell in the non-zero group, and pixel number data indicating the number of non-zero pixels.

Figure 8:
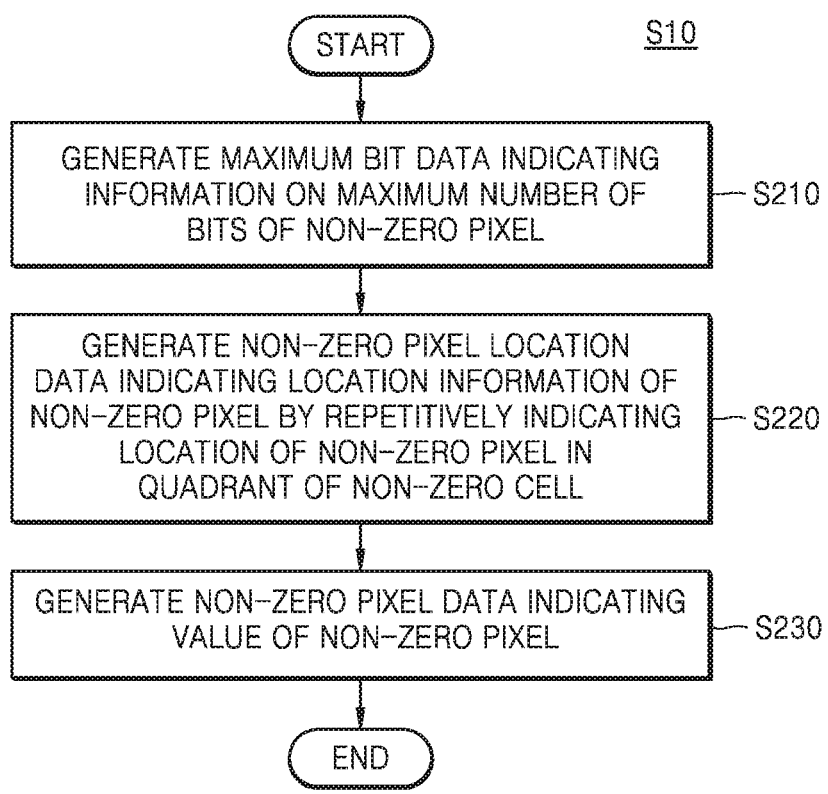
FIG. 8 is a flowchart of a method of operating a compressor according to another example embodiment.

FIG. 8 is a flowchart of a method of operating a compressor according to another example embodiment. In detail, FIG. 8 is at least a portion (S10 of FIG. 6) of a method, performed by a compressor, of generating compressed data and shows a method of generating cell data indicating location information of a non-zero pixel in a non-zero cell and a data value of the non-zero pixel.

Referring to FIGS. 5 and 8, in operation S210, the compressor 120 may generate maximum bit data indicating information on a maximum number of bits of a non-zero pixel. In operation S220, the compressor 120 may generate pixel location data indicating location information of the non-zero pixel by repetitively indicating a location of the non-zero pixel on a quadrant of a non-zero cell. In operation S230, the compressor 120 may generate non-zero pixel data indicating a value of the non-zero pixel.

According to an example embodiment, the compressor 120 may generate at least one piece of cell data including maximum bit data indicating information on a maximum bit width of a non-zero pixel, pixel location data indicating location information of the non-zero pixel in a non-zero cell, and non-zero pixel data indicating a value of the non-zero pixel.

Figure 9:
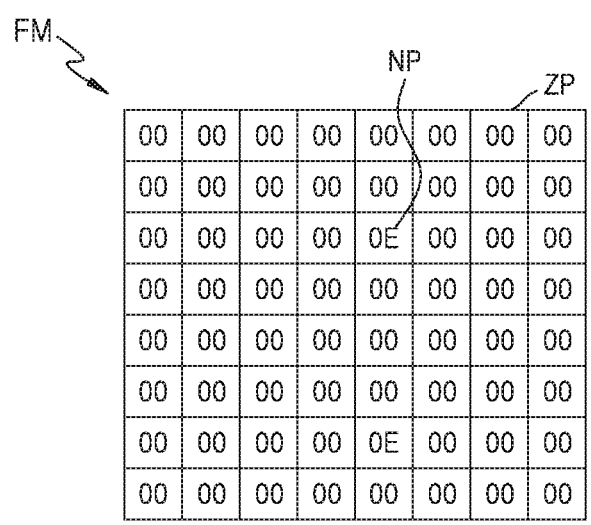
FIG. 9 illustrates an input featuremap according to an example embodiment.

FIG. 9 illustrates an input featuremap according to an example embodiment.

Referring to FIG. 9, an input featuremap FM may include 8×8 pixels, and a plurality of pixels may include a zero pixel ZP having '0' as a data value and a non-zero pixel NP having a value that is not '0' as a data value. As described above, a ReLU operation is applicable to the featuremap FM, and thus, pixels having a data value corresponding to a negative number among the plurality of pixels may be replaced by zero pixels ZP.

Although FIG. 9 shows pixels having eight-bit data, this is only illustrative, and each of the plurality of pixels may have data greater than or less than eight bits. In addition, although FIG. 9 shows an example in which the featuremap FM includes 8×8 pixels, the featuremap FM may include pixels greater than or less than 8×8.

Figure 10:
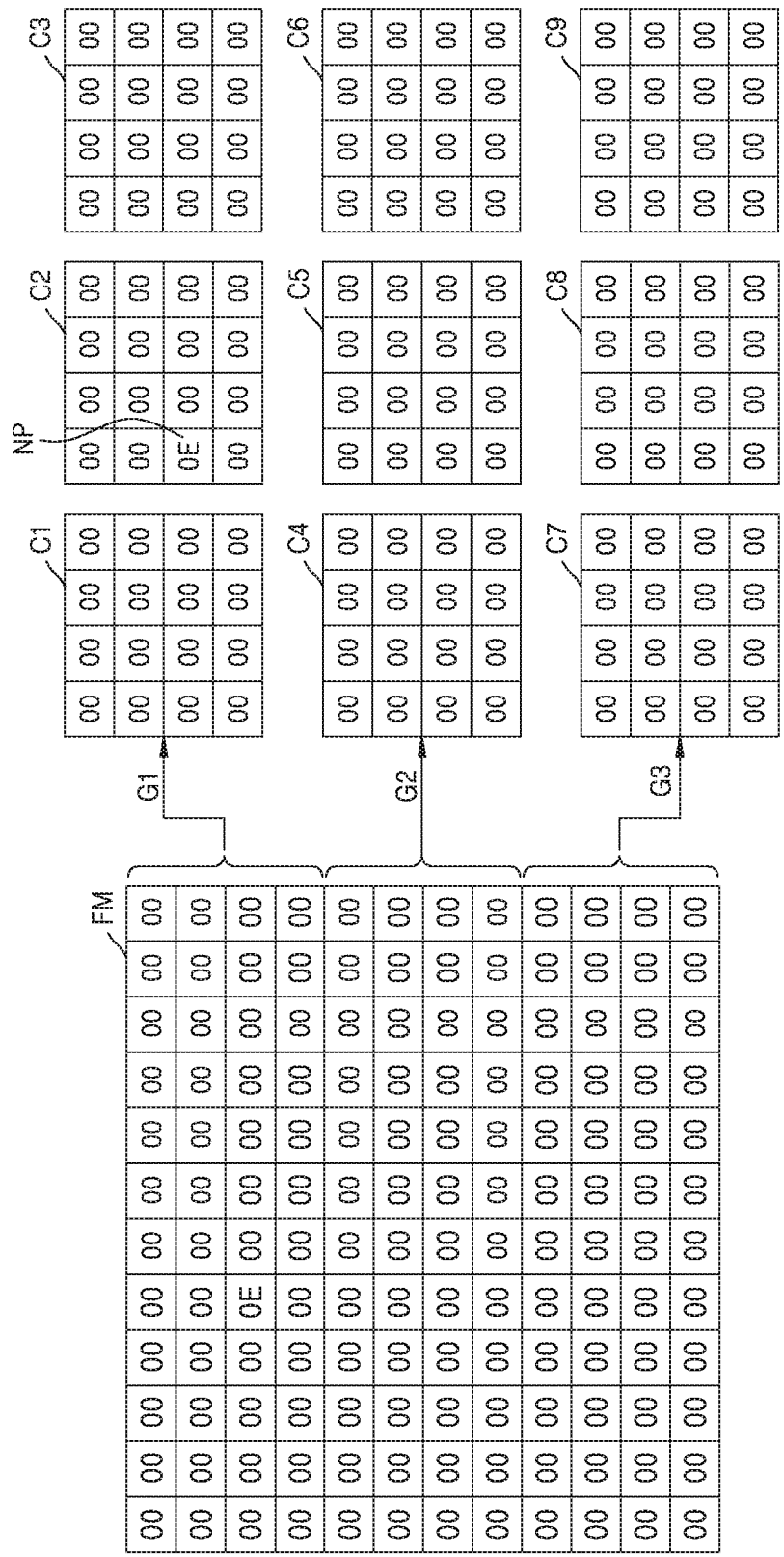
FIG. 10 illustrates a featuremap according to an example embodiment.

FIG. 10 illustrates a featuremap according to an example embodiment.

Referring to FIG. 10, a featuremap FM may include three groups, e.g., a first group G1, a second group G2, and a third group G3, divided in row units. The first group G1 may include a first cell C1, a second cell C2, and a third cell C3, the second group G2 may include a fourth cell C4, a fifth cell C5, and a sixth cell C6, and the third group C3 may include a seventh cell C7, eighth cell C8, and a ninth cell C9. In the example of FIG. 10, a cell indicates a pixel unit including 4×4 pixels, and the second cell C2 includes a non-zero pixel NP, and thus, the second cell C2 may be referred to as a non-zero cell. In addition, the first group G1 including the second cell C2 that is a non-zero cell may be referred to as a non-zero group.

FIG. 11 illustrates a method of generating compressed data according to an example embodiment. In detail, FIG. 11 illustrates a method of generating compressed data when a featuremap includes one non-zero pixel.

Referring to FIGS. 5 and 11, the fifth cell C5 constituting the featuremap FM may include one non-zero pixel NP. According to an example embodiment, the compressor 120 may generate compressed data CD by using the featuremap FM based on a quad-tree QT.

The compressor 120 may generate group mapping data GMD by indicating whether each of a plurality of groups includes the non-zero pixel NP at a corresponding bit. In the example of FIG. 11, the first group G1 and the third group G3 may not include the non-zero pixel NP, and the second group G2 may include a non-zero pixel NP. The compressor 120 may configure, as '0', a first bit corresponding to the first group G1 and a third bit corresponding to the third group G3 and configure, as '1', a second bit corresponding to the second group G2, and as a result, the compressor 120 may generate '010' as the group mapping data GMD.

Because both the first group G1 and the third group G3 have '00' as pixel data, the compressor 120 may ignore data of the first group G1 and the third group G3.

The compressor 120 may generate cell mapping data CMD by indicating whether each of a plurality of cells included in the second group G2 includes the non-zero pixel NP at a corresponding bit. In the example of FIG. 11, the fourth cell C4 and the sixth cell C6 may not include a non-zero pixel NP, and the fifth cell C5 may include the non-zero pixel NP. The compressor 120 may configure, as '0', a first bit corresponding to the fourth cell C4 and a third bit corresponding to the sixth cell C6 and configure, as '1', a second bit corresponding to the fifth cell C5, and as a result, the compressor 120 may generate '010' as the cell mapping data CMD. Because both the fourth cell C4 and the sixth cell C6 have '00' as pixel data, the compressor 120 may ignore data of the fourth cell C4 and the sixth cell C6. Although FIG. 11 shows that three bits are allocated as the group mapping data GMD and the cell mapping data CMD, this is only illustrative, and more or less bits than three bits may be allocated as the group mapping data GMD and the cell mapping data CMD based on the number of groups and the number of cells.

The compressor 120 may generate pixel number data PND based on the number of non-zero pixels NP. In the example of FIG. 11, the number of non-zero pixels NP is 1, and thus, the compressor 120 may generate, as the pixel number data PND, '001' corresponding to the number of non-zero pixels NP. Although FIG. 11 shows that three bits are allocated as the pixel number data PND, this is only illustrative, and more or less bits than three bits may be allocated as the pixel number data PND.

The compressor 120 may generate bitmap data BMD including the group mapping data GMD, the cell mapping data CMD, and the pixel number data PND as described above. According to an example embodiment, the compressor 120 may add arbitrary pad bits to the bitmap data BMD to meet the number of bits (e.g., a multiple of eight bits).

The compressor 120 may divide the fifth cell C5 into quadrants and indicate whether each of the quadrants includes the non-zero pixel NP at a corresponding bit, thereby generating at least one piece of pixel location data. In the example of FIG. 11, a first quadrant Q1, a second quadrant Q2, and a fourth quadrant Q4 may not include the non-zero pixel NP, and a third quadrant Q3 may include the non-zero pixel NP. Therefore, the compressor 120 may configure, as '0', a first bit corresponding to the first quadrant Q1, a second bit corresponding to the second quadrant Q2, and a fourth bit corresponding to the fourth quadrant Q4 and configure, as '1', a third bit corresponding to the third quadrant Q3, and as a result, the compressor 120 may generate '0010' as first pixel location data PLD1.

The compressor 120 may generate pixel location data as described above until the non-zero pixel NP is specified. In the example of FIG. 11, the third quadrant Q3 includes four pixels, and the non-zero pixel NP is located at a first location (upper left) in the third quadrant Q3, and thus, the compressor 120 may configure, as '1', only a bit corresponding to the non-zero pixel NP and configure, as '0', bits located at the remaining locations. As a result, the compressor 120 may generate '1000' as second pixel location data PLD2.

In FIG. 11, a non-zero pixel is specified with two pieces of pixel location data, and thus, the two pieces of pixel location data are included in the compressed data CD, but embodiments are not limited thereto, and two or more or less pieces of pixel location data may be included in the compressed data CD.

The compressor 120 may generate non-zero pixel data NPD based on a data value of the non-zero pixel NP. In the example of FIG. 11, the non-zero pixel NP has an eight-bit data value of '02', and thus, the compressor 120 may generate a two-bit data value of '00000010' as the non-zero pixel data NPD to correspond to the eight-bit data value of '02'.

The compressor 120 may generate cell data CLD including the first pixel location data PLD1, the second pixel location data PLD2, and the non-zero pixel data NPD and generate compressed data CD including the bitmap data BMD and the cell data CLD. According to an example embodiment, the compressor 120 may add arbitrary pad bits to the cell data CLD to meet the number of bits (e.g., a multiple of eight bits).

According to an example embodiment, a location of a non-zero pixel may be specified based on a quad-tree, and compressed data CD may be generated by using the specified location of the non-zero pixel, thereby reducing a data amount of the compressed data CD and increasing a data transmission rate.

According to an example embodiment, the compressor 120 may restore the featuremap FM based on the compressed data CD. According to an example embodiment, the compressor 120 may restore a location of a non-zero cell based on the group mapping data GMD and the cell mapping data CMD, restore the number of non-zero pixels based on the pixel number data PND, and restore a location of a non-zero pixel based on the first pixel location data PLD1 and the second pixel location data PLD2. The compressor 120 may restore the featuremap FM by inputting a data value of the non-zero pixel at the restored location of the non-zero pixel based on the non-zero pixel data NPD and inputting '00' at the remaining locations.

Although FIG. 11 shows an example in which the compressed data CD sequentially includes the group mapping data GMD, the cell mapping data CMD, the pixel number data PND, the first pixel location data PLD1, the second pixel location data PLD2, and the non-zero pixel data NPD, this is only illustrative, and the compressed data CD may be generated by various sequence combinations of the data described above.

FIG. 12 illustrates a method of generating compressed data, according to another example embodiment. In detail, FIG. 12 illustrates a method of generating compressed data when a featuremap includes one non-zero pixel. The description made with reference to FIG. 11 is not repeated herein.

Referring to FIGS. 5 and 12, the compressor may generate maximum bit data MBD. The maximum bit data MBD may indicate a maximum number of bits of a data value of a non-zero pixel NP. According to an example embodiment, the maximum bit data MBD may have, as a data value, 'the maximum number of bits of a data value of the non-zero pixel NP−1'. In the example of FIG. 12, the data value of the non-zero pixel NP is '02', and thus, the maximum number of bits of the data value of the non-zero pixel NP may be 2. Therefore, the maximum bit data MBD may be configured as '001' corresponding to two bits. According to an example embodiment, at least one bit is present as the data value of the non-zero pixel NP, and thus, '000' may correspond to one bit, and '001' may correspond to two bits. For example, the maximum bit data MBD corresponding to eight bits may '111'.

When the maximum bit data MBD is present, the compressor 120 may change the non-zero pixel data NPD from '00000010' to '10' by removing unnecessary '0's. In the restoration process, the compressor 120 may consider pixel data as '02' by considering the maximum bit data MBD.

FIG. 13A illustrates a method of generating compressed data according to another example embodiment. In detail, FIG. 13A illustrates a method of generating compressed data when one cell includes a plurality of non-zero pixels. The description made with reference to FIGS. 11 and 12 is not repeated herein. Particularly, a method of generating group mapping data GMD and cell mapping data CMD in bitmap data BMD has been described above with reference to FIG. 11, and thus, the description thereof is not repeated herein.

Referring to FIGS. 5 and 13A, the compressor 120 may generate '010' as the pixel number data PND because the fifth cell C5 includes two non-zero pixels, for example, a first non-zero pixel NP1 and a second non-zero pixel NP2. The compressor 120 may generate, as the maximum bit data MBD, '011' corresponding to four bits because a data value of the second non-zero pixel NP2 is '0E' and may be represented with four bits.

The compressor 120 may configure, as '0', a first bit corresponding to the first quadrant Q1 and a fourth bit corresponding to the fourth quadrant Q4, and configure, as '1', a second bit corresponding to the second quadrant Q2 and a third bit corresponding to the third quadrant Q3. Thus, the compressor 120 may generate '0110' as first pixel location data PLD1 because the first non-zero pixel NP1 is located in the second quadrant Q2 and the second non-zero pixel NP2 is located in the third quadrant Q3. In addition, because the first non-zero pixel NP1 is located at a second location (upper right) in the second quadrant Q2, the compressor 120 may generate '0100' as second pixel location data PLD2, and because the second non-zero pixel NP2 is located at a first location (upper left) in the third quadrant Q3, the compressor 120 may generate '1000' as third pixel location data PLD3.

The compressor 120 may generate, as first non-zero pixel data NPD1, '1110' corresponding to '0E' that is a data value of the first non-zero pixel NP1, generate, as second non-zero pixel data NPD2, '0010' corresponding to '01' that is a data value of the second non-zero pixel NP2, and generate compressed data CD by arranging the generated pieces of data according to a previously defined rule.

FIG. 13B illustrates a method of generating compressed data according to another example embodiment. In detail, FIG. 13B illustrates a method of generating compressed data when one cell includes a plurality of non-zero pixels. The description made with reference to FIG. 13A is not repeated herein.

Referring to FIGS. 5 and 13B, the compressor 120 may generate first maximum bit data MBD1 and second maximum bit data MBD2 for first non-zero pixel NP1 and second non-zero pixel NP2, respectively. The compressor 120 may generate first sub-cell data SCLD1 including the first maximum bit data MBD1, first pixel location data PLD1, second pixel location data PLD2, and first non-zero pixel data NPD1 in correspondence to the first non-zero pixel NP1, and generate second sub-cell data SCLD2 including the second maximum bit data MBD2, third pixel location data PLD3, fourth pixel location data PLD4, and second non-zero pixel data NPD2 in correspondence to the second non-zero pixel NP2. A method of generating each data has been described above, and thus, the description thereof is not repeated herein.

Figure 13C:
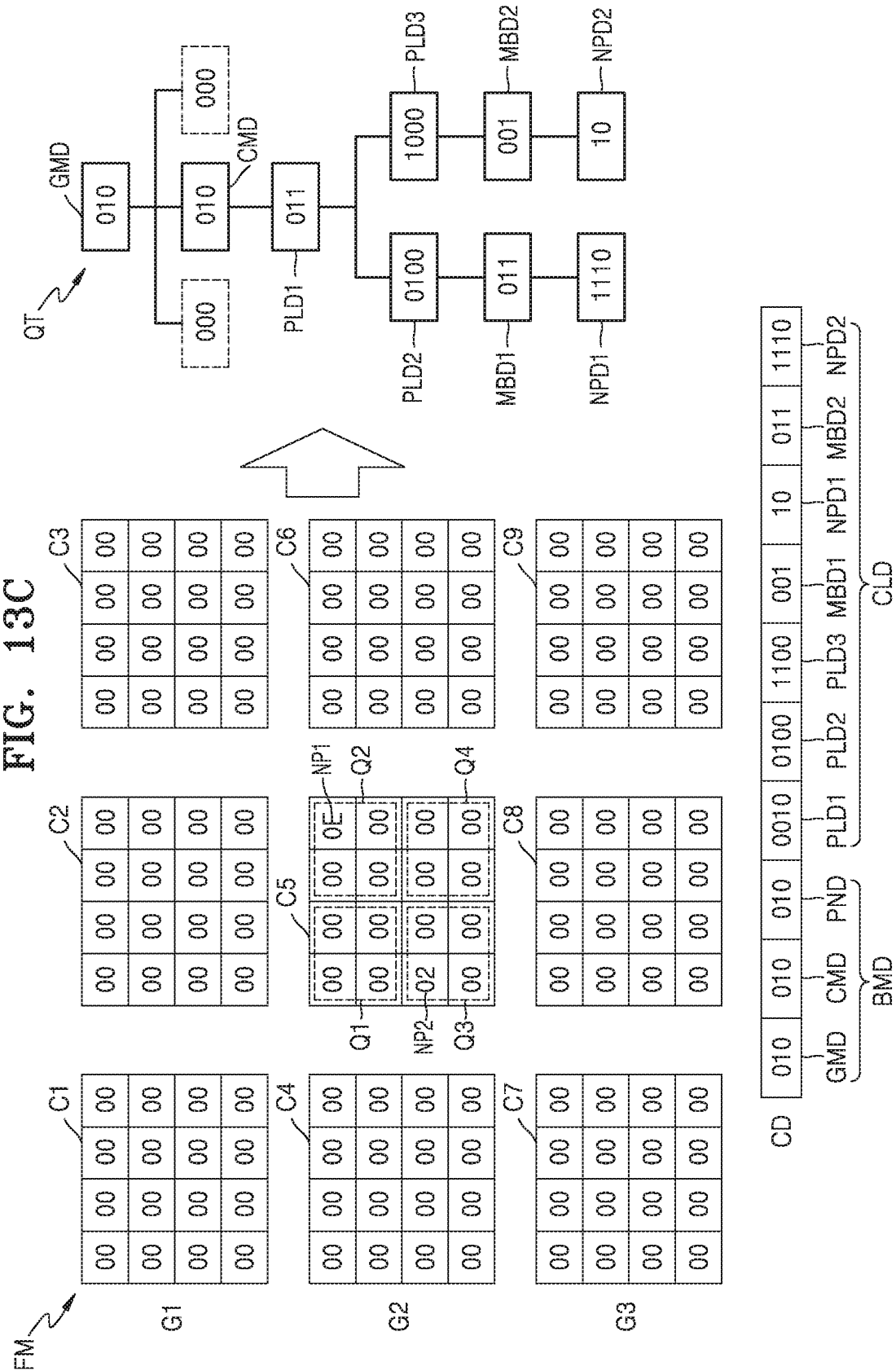
FIG. 13C illustrates a method of generating compressed data according to another example embodiment.

FIG. 13C illustrates a method of generating compressed data according to another example embodiment. In detail, FIG. 13C illustrates a method of generating compressed data when one cell includes a plurality of non-zero pixels. The description made with reference to FIG. 13A is not repeated herein.

Referring to FIGS. 5 and 13C, the compressor 120 may generate first maximum bit data MBD1 and second maximum bit data MBD2 for first non-zero pixel NP1 and second non-zero pixel NP2, respectively. The compressor 120 may generate first pixel location data PLD1, second pixel location data PLD2, and third pixel location data PLD3 based on locations of the first non-zero pixels NP1 and second non-zero pixel NP2 in the fifth cell C5. In addition, the compressor 120 may generate the first maximum bit data MBD1 and first non-zero pixel data NPD1 in correspondence to the first non-zero pixel NP1 and generate the second maximum bit data MBD2 and second non-zero pixel data NPD2 in correspondence to the second non-zero pixel NP2. A method of generating each data has been described above, and thus, the description thereof is not repeated herein.

Figure 14:
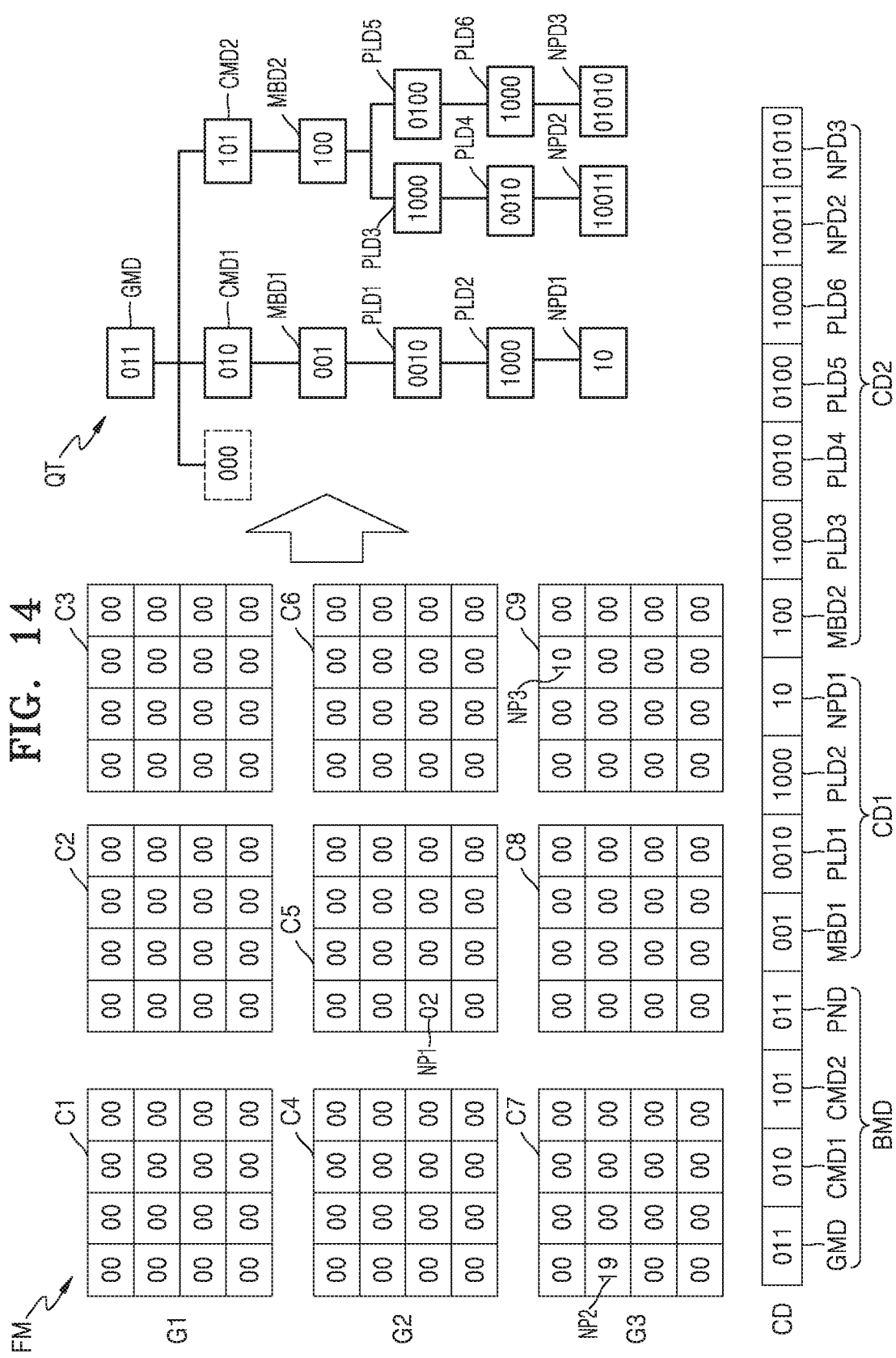
FIG. 14 illustrates a method of generating compressed data according to another example embodiment.

FIG. 14 illustrates a method of generating compressed data according to another example embodiment. In detail, FIG. 14 illustrates a method of generating compressed data when a plurality of cells include at least one of non-zero pixels. The description made with reference to FIGS. 11 and 12 is not repeated herein. Particularly, a method of generating bitmap data BMD has been described above with reference to FIG. 11, and thus, the description thereof is not repeated herein.

Referring to FIGS. 5 and 14, the compressor 120 may generate '011' as pixel number data PND because the featuremap FM includes three non-zero pixels, for example, first non-zero pixels NP1, second non-zero pixel NP2, and third non-zero pixel NP3. The compressor 120 may generate first cell data CD1 by the same method as described above with reference to FIG. 12.

The compressor 120 may configure '101' as second cell mapping data CMD2 because the seventh cell C7 in the third group G3 includes the second non-zero pixel NP2 and the ninth cell C9 includes the third non-zero pixel NP3. In addition, the compressor 120 may configure '100' as second maximum bit data MBD2 based on '19' that is a data value of the second non-zero pixel NP2 having a greater data value between the second non-zero pixel NP2 and the third non-zero pixel NP3.

The compressor 120 may generate third pixel location data PLD3 and fourth pixel location data PLD4 based on a location of the second non-zero pixel NP2 and generate second non-zero pixel data NPD2 based on the data value of the second non-zero pixel NP2. In addition, the compressor 120 may generate fifth pixel location data PLD5 and sixth pixel location data PLD6 based on a location of the third non-zero pixel NP3 and generate third non-zero pixel data NPD3 based on a data value of the third non-zero pixel NP3.

The compressor 120 may generate compressed data CD by arranging the generated pieces of data according to a previously defined rule.

Figure 15:
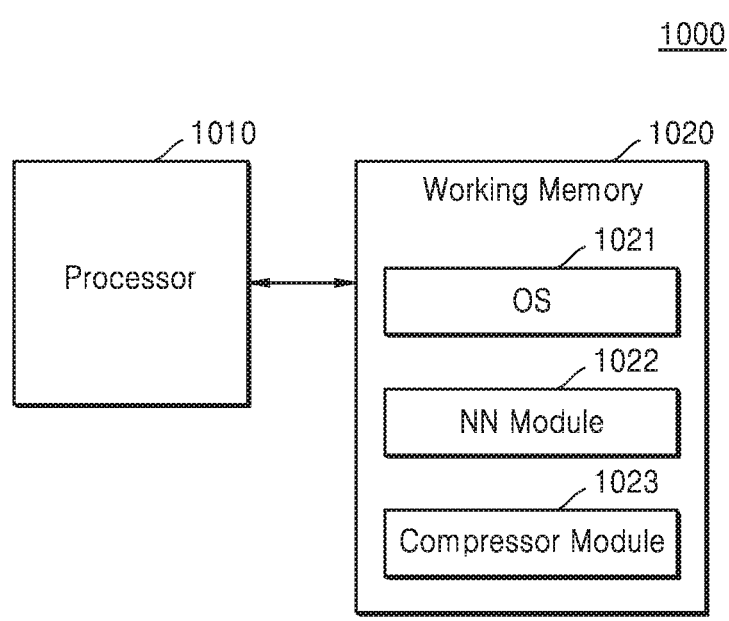
FIG. 15 is a block diagram of an application processor according to an example embodiment.

FIG. 15 is a block diagram of an application processor 1000 according to an example embodiment. The application processor 1000 may be implemented by a system on chip (SoC) as a semiconductor chip.

Referring to FIG. 15, the application processor 1000 may include a processor 1010 and a working memory 1020. In addition, the application processor 1000 may further include one or more IP modules connected to a system bus. The working memory 1020 may store software such as various kinds of programs and instructions related to an operation of a system employing the application processor 1000 and may include, for example, an OS 1021, a neural network (NN)

module 1022, and a compressor module 1023. The compressor module 1023 may function as the compressor according to the example embodiments described above.

The NN module 1022 may execute an arithmetic operation of an existing neural network processor or the neural network processor according to the example embodiments. In addition, the compressor module 1023 may receive an input neural network model and perform a compression operation according to the example embodiment. According to an example embodiment, the NN module 1022 may be implemented in the OS 1021.

Although FIG. 15 shows one processor 1010, the application processor may include a plurality of processors. In this case, some of the plurality of processors may correspond to general processors, and the other may be exclusive processors for executing a neural network model.

While example embodiments have been described with reference to the figures, it will be understood by those of ordinary skill in the art that various changes in form and details may be made therein without departing from the spirit and scope as defined by the following claims.

What is claimed is:

1. A neural network device comprising:
at least one processor configured to implement:
an arithmetic circuit configured to generate third data comprising a plurality of pixels based on a neural network configured to perform an arithmetic operation on first data and second data; and
a compressor configured to generate compressed data by compressing the third data,
wherein the compressor is further configured to generate, as the compressed data, bitmap data comprising location information about a non-zero pixel having a non-zero data value among the plurality of pixels based on a quad-tree structure,
wherein the third data comprises a plurality of cells, each of the plurality of cells comprising n×n pixels, where n is a natural number, and
wherein the bitmap data comprises information on a location about a non-zero cell comprising the non-zero pixel among the plurality of cells, and
wherein the bitmap data comprises:
group mapping data indicating information on a non-zero group comprising the non-zero cell among a plurality of groups divided in row units from the plurality of cells; and
cell mapping data indicating information on the non-zero cell in the non-zero group.

2. The neural network device of claim 1, wherein the bitmap data indicates the location about the non-zero cell by repetitively indicating the location about the non-zero cell on a plurality of division planes for at least a portion of the third data.

3. The neural network device of claim 1, wherein the group mapping data comprises '1' as a bit corresponding to the non-zero group and comprises '0' as a bit corresponding to groups among the plurality of groups other than the non-zero group, and
wherein the cell mapping data comprises '1' as a bit corresponding to the non-zero cell and comprises '0' as a bit corresponding to cells among the plurality of cells other than the non-zero cell.

4. The neural network device of claim 1, wherein the plurality of cells comprise a first non-zero cell and a second non-zero cell, and
wherein the cell mapping data comprises first sub-cell mapping data indicating a location about the first non-zero cell and second sub-cell mapping data indicating a location about the second non-zero cell.

5. The neural network device of claim 1, wherein the bitmap data further comprises pixel number data indicating a number of non-zero pixels included in the non-zero cell.

6. The neural network device of claim 1, wherein the compressed data further comprises at least one piece of cell data indicating location information and data information about the non-zero pixel.

7. The neural network device of claim 6, wherein each of the at least one piece of cell data comprises pixel location data indicating information on a location about the non-zero pixel in the non-zero cell and non-zero pixel data indicating a data value of the non-zero pixel.

8. The neural network device of claim 7, wherein the pixel location data is generated based on a quad-tree which indicates the location about the non-zero pixel by repetitively indicating the location about the non-zero pixel on a plurality of division planes for at least a portion of the third data.

9. The neural network device of claim 7, wherein the compressed data further comprises maximum bit data indicating a maximum number of bits of the data value of the non-zero pixel.

10. The neural network device of claim 9, wherein a data value of the maximum bit data is m−1, where the maximum number of bits of the non-zero pixel is m.

11. A computing system comprising:
a memory configured to store at least one program; and
a processor configured to process an arithmetic operation of a neural network on a featuremap comprising a plurality of pixels by executing the at least one program,
wherein the processor is further configured to compress the featuremap by generating bitmap data comprising location information about a non-zero pixel having a non-zero data value among the plurality of pixels, and
wherein the processor is further configured to generate at least one piece of cell data indicating location information about the non-zero pixel and data information about the non-zero pixel.

12. The computing system of claim 11, wherein the memory is further configured to store compressed data generated based on the compression of the featuremap.

13. The computing system of claim 11, wherein the processor is further configured to generate the bitmap data based on a quad-tree which indicates a location about the non-zero pixel by repetitively indicating the location about the non-zero pixel on a plurality of division planes for at least a portion of the featuremap.

14. The computing system of claim 11, wherein the featuremap comprises a plurality of cells, each of the plurality of cells comprising n×n pixels, where n is a natural number, and
wherein the processor is further configured to generate, as the bitmap data:
group mapping data comprising information on a non-zero group comprising a non-zero cell among a plurality of groups divided in row units from the plurality of cells; and
cell mapping data indicating information on the non-zero cell in the non-zero group.

15. The computing system of claim 14, wherein the processor is further configured to generate:

for the group mapping data, '1' as a bit corresponding to the non-zero group and '0' as a bit corresponding to groups among the plurality of groups other than the non-zero group, and for the cell mapping data, '1' as a bit corresponding to the non-zero cell and '0' as a bit corresponding to cells among the plurality of cells other than the non-zero cell.

16. The computing system of claim 14, wherein the processor is further configured to generate pixel number data indicating the number of non-zero pixels included in the non-zero cell as the bitmap data.

17. A method of processing a featuremap of a neural network in a computing system comprising a memory, the method comprising:

generating compressed data by compressing data;

generating, as the compressed data, bitmap data based on location information repetitively indicating a location, on a division plane of the featuremap, about a non-zero pixel having a non-zero data value among a plurality of pixels included in the featuremap and based on data of the non-zero pixel; and storing the compressed data in the memory, wherein the data comprises a plurality of cells, each of the plurality of cells comprising n×n pixels, where n is a natural number, and wherein the bitmap data comprises information on a location about a non-zero cell comprising the non-zero pixel among the plurality of cells, and wherein the bitmap data further comprises pixel number data indicating a number of non-zero pixels included in the non-zero cell.

\* \* \* \* \*